United States Patent [19]
Cook

[11] Patent Number: 5,595,783
[45] Date of Patent: Jan. 21, 1997

[54] SPIN COATING FIXTURE

[75] Inventor: Richard S. Cook, Chino, Calif.

[73] Assignee: Northrop Grumman Corporation, Los Angeles, Calif.

[21] Appl. No.: 393,215

[22] Filed: Feb. 22, 1995

[51] Int. Cl.$^6$ .............................. B05D 3/12; B05C 13/00
[52] U.S. Cl. .................. 427/240; 118/52; 118/320; 427/421; 427/430.1
[58] Field of Search .................................... 427/240, 421, 427/430.1; 118/52, 320

[56] References Cited

U.S. PATENT DOCUMENTS

| | | | |
|---|---|---|---|
| 3,503,796 | 3/1970 | Maddison | 427/240 |
| 4,875,434 | 10/1989 | Maejimo et al. | 118/52 |
| 5,042,421 | 8/1991 | Anbe | 118/52 |

Primary Examiner—Janyce Bell
Attorney, Agent, or Firm—Stetina Brunda & Buyan

[57] ABSTRACT

A spin coating fixture for holding a planar substrate includes a base, against which the substrate bears, and self-engaging tooling pins that bear against the substrate, holding the substrate in the fixture. The self-engaging tooling pins are preferably connected to weights, which respond to forces generated by rotation of the fixture. Changing directions of gravitational forces and centrifugal forces on the weights are operative to cause the weights to move, bringing the tooling pins into contact with the substrate. Prior to the spin coating operation, the substrate is lowered straight down into the fixture. Upon beginning rotation of the fixture, the tooling pins are self-engaged to hold the substrate. After the spinning operation is completed, the tooling pins self-disengage allowing immediate and unobstructed removal of the substrate.

30 Claims, 1 Drawing Sheet

SPIN COATING FIXTURE

FIELD OF THE INVENTION

The present invention relates generally to coating non-conductive substrates for electronic devices, and more particularly to spin coating of conductive thin film.

BACKGROUND OF THE INVENTION

Thin films have been in use for well over a thousand years. Among the earliest uses were decorative thin films on glass and ceramics. From the early examples have evolved the diverse types of thin films currently used. Included are thin films used for protective and insulating purposes, as well as the conductive thin films used in micro-electronics.

Desirable properties of thin films include uniform thickness and an absence of voids. Spin coating is a well recognized method to uniformly distribute thin film across the surface of a substrate. The coating is applied to the substrate, and then the substrate is rotated rapidly about an axis parallel to the plane of the substrate. One of the most problematic areas associated with the spin coating method is in holding the substrate for the application of the coating and the subsequent spinning operation. Prior art techniques of holding the substrate for spin coating have included manual clamps that are engaged by the operator, and mechanically actuated clamps. These techniques require the step of the operator engaging the clamp. The clamps may potentially damage the substrate, and the mechanical actuators are subject to breakdown. Other prior art techniques have included vacuum fixtures. However, the use of vacuum fixtures is undesirable in that the vacuum ports thereof tend to draw in the coating material.

Although the spin coating fixtures of the prior art fixtures have proven generally suitable for their intended purposes, they possess inherent deficiencies which detract from their overall effectiveness and desirability. In view of the shortcomings of the prior art, it is desirable to provide a spin coating fixture that does not require the operator to engage tooling pins to hold the substrate. It is further desirable to provide a spin coating fixture that does not require mechanical actuators or vacuum ports.

SUMMARY OF THE INVENTION

The present invention addresses and alleviates the above-mentioned deficiencies associated with the prior art. Generally, the present invention comprises a fixture to hold a planar substrate for spin coating, the fixture including self-engaging tooling pins that bear against the substrate, holding the substrate in the fixture. The self-engaging tooling pins move in response to forces generated by rotation of the fixture to firmly hold the substrate in the fixture. Also, after the spin coating operation is completed and the fixture and substrate are returned to an upright orientation, the tooling pins self-disengage from the substrate to allow immediate and unobstructed removal thereof from the fixture.

More particularly, the present invention comprises a fixture that includes a base that one side of the substrate bears against, and at least one gravity-operated tooling mechanism that responds to changes in the direction of gravity forces to engage a gravity operated tooling pin against the substrate. The fixture further includes at least one centrifugal-operated tooling mechanism that responds to centrifugal forces generated by spinning of the fixture. The preferred embodiment includes a combination, gravity/centrifugal-operated tooling mechanism that responds to both the gravity forces and to the centrifugal forces.

The preferred method of holding the substrate for spin coating includes lowering the substrate into the fixture, and first rotating the fixture for spray application of the coating to both sides of the substrate. Alternatively, dip coating may be applied to the substrate prior to installing it into the fixture. The gravity-operated tooling mechanism that responds to changes in the direction of the gravity forces is engaged to hold the substrate in the fixture. Next, the fixture is spun at a rapid rate to provide uniform distribution of the coating over the surfaces of the substrate. The centrifugal-operated tooling mechanism that responds to the centrifugal forces generated by the spinning of the fixture is engaged to hold the substrate in the fixture. During the start-up and slow-down of the spin operation, the gravity-operated tooling mechanism holds the substrate until the centrifugal-operated tooling mechanism is engaged. When the spinning operation is completed and the fixture and substrate are returned to an upright orientation, all the tooling mechanisms disengage allowing immediate and unobstructed removal of the substrate.

These, as well as other advantages of the present invention will become more apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed discussion set forth below in connection with the appended drawings is intended as a description of the presently preferred embodiment of the invention, and is not intended to represent the only form in which the present invention may be constructed or utilized. The description sets forth the functions and sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

Figure 1:
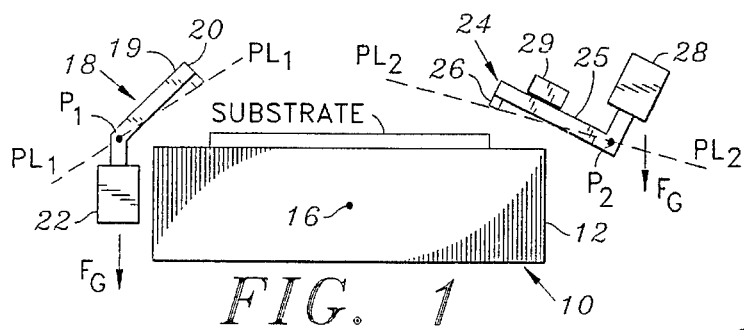
FIG. 1 is a side view of the fixture of the present invention in a disengaged orientation with a substrate mounted thereon.
Figure 3:
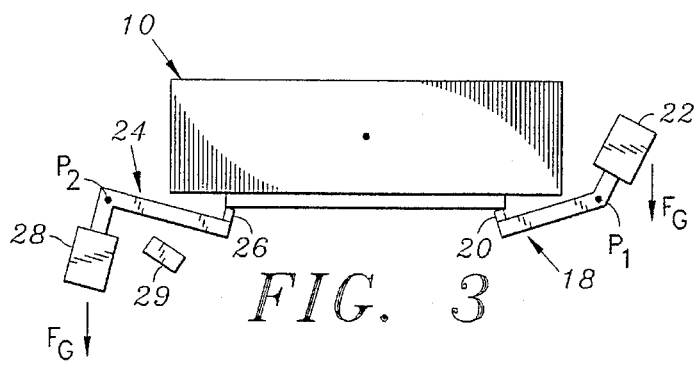
FIG. 3 is a side view of the fixture in another engaged orientation.
Figure 4:
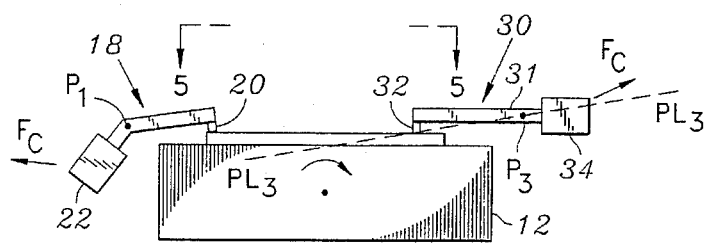
FIG. 4 is a side view of the fixture in an engaged orientation caused by the centrifugal forces.
Figure 5:
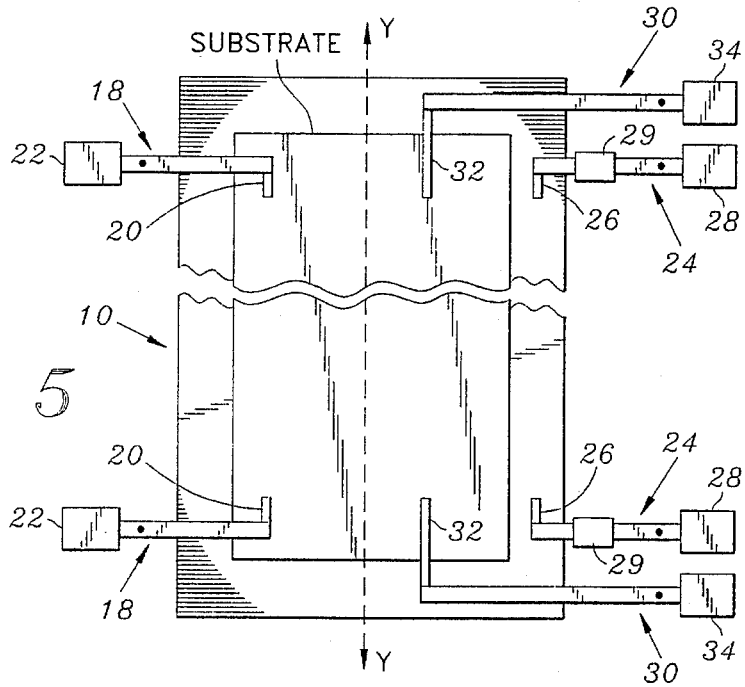
FIG. 5 is an overall top view of the fixture of the present invention.

The spin coating fixture of the present invention is illustrated in FIGS. 1–5 which depict a presently preferred embodiment of the invention. Evident from the overall top view of FIG. 5 is that in the preferred embodiment there are a pair of first tooling pins 20, a pair of second tooling pins 26, and a pair of third tooling pins 32. Referring now to the side view of FIG. 1, the pertinent features of the fixture 10 are shown. The fixture 10 includes a base 12 free to rotate about an axis Y (also shown in FIG. 5) parallel to the plane of the substrate. In this preferred embodiment the axis Y approximately intersects the center of gravity 16 of the base 12. In this respect, when the base 12 is rotated about the axis Y, inertia forces are not generated on the base 12 that tend to drive the base 12 away from the axis Y. The base 12 is preferably made of a strong, rigid material, though the base 12 may include cutouts (not shown) where the substrate bears against the base 12 to allow spin coating of both sides of the substrate. A first tooling mechanism 18 is preferably pivotally attached to the base 12 at a first pivot $P_1$. The first tooling mechanism 18 preferably comprises an 'L' shaped first link 19 that connects a first tooling pin 20 and a first weight 22. On the opposing side of the base 12 is a second tooling mechanism 24 also preferably pivotally connected to the base 12 at a second gravity operated pivot $P_2$. The second tooling mechanism 24 preferably comprises a 'Z' shaped second link 25 that connects a second tooling pin 26 and a second weight 28. The exact shape of the links 19 and 25 is not critical. What is important is the position of the centers of gravity of the weights 22 and 28 relative to respective planes $PL_1$ and $PL_2$ that include the respective pivot pins 20 and 26 the respective pivot points $P_1$ and $P_2$, for reasons which will become clear later in this discussion. A stop 29 is operative to limit the travel of the weight 28 as it is pivoted, for reasons that will become clear later in this discussion. FIG. 1 shows the fixture 10 in an upright orientation, and the downward gravity forces ($F_G$) exerted on the weights 22 and 28 are depicted.

Figure 2:
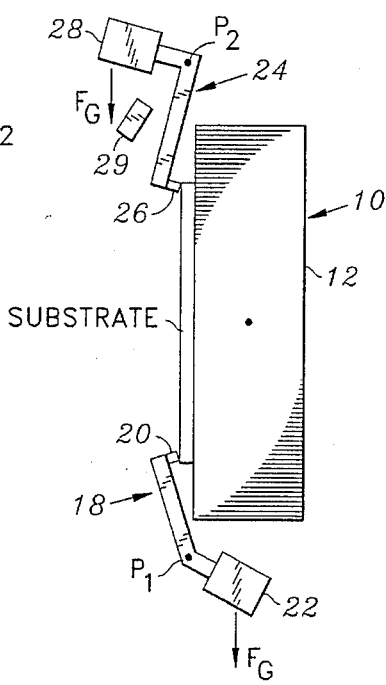
FIG. 2 is a side view of the fixture in an engaged orientation caused by the changed gravity load.

Now referring to FIG. 2, the fixture 10, including the base 12, the first tooling mechanism 18 and the second tooling mechanism 24, have been rotated 90° counter-clockwise. The change in direction of the gravity forces ($F_G$) on the weights 22 and 28, have caused the weights 22 and 28 of the tooling mechanisms 18 and 24 to pivot, bringing the tooling pins 20 and 26 into contact with the substrate. Now referring to FIG. 3, the fixture 10 has been rotated an additional 90° counter-clockwise. Again the changing direction of the gravity forces ($F_G$) on the weights 22 and 28 is indicated. The tooling pins 20 and 26 remain in contact with the substrate.

Now referring to FIG. 4, the setup of the tooling fixture 10 during the spinning operation may be described. The fixture 10 is spun rapidly in a clockwise direction in this preferred embodiment, though the fixture 10 could be configured to spin counter-clockwise. A third centrifugal-operated tooling mechanism 30 is pivotally attached to the base 12 at third pivot $P_3$. The third tooling mechanism 30 preferably comprises an in-line third link 31 that connects a third tooling pin 32 and a third weight 34. Again, the exact shape of the link 31 is not critical. Important here is the position of the center of gravity of the weight 34 relative to a plane $PL_3$ that includes the Y axis and the $P_3$ pivot point, for reasons which will become clear later in this discussion. The "centrifugal" forces ($F_C$) that act on the weights 22 and 34 during the spinning operation are indicated.

The concept of "centrifugal" force may be briefly explained, with reference to the third tooling mechanism 30. During the spinning operation, the weight 34 is traveling with an instantaneous velocity in a direction tangential to a circular path. To maintain a weight 34 in a circular path, a centripetal force (not shown) acting towards the center of the circle must be applied to the weight 34. The centripetal force is applied to the weight 34 through the third link 31 that is connected to the rotating fixture 10. The weight 34 as rotating in the circular path experiences a centrifugal force ($F_C$), apparently acting away from the center of rotation, numerically equal to the external centripetal force. Because, from the point of view of an observer external to the rotating weight 34, the centrifugal force ($F_C$) has no real existence, it is often termed a "fictitious" force.

Now referring to FIG. 5 which is a top view of the fixture 10 during the spinning operation. As is evident from FIG. 5, the tooling pins 20, 26, and 32 are preferably elongate to distribute the load on the substrate. Also evident from FIG. 5 is the location of the second tooling pin 26 and second weight 28 during the spinning operation, as the second tooling mechanism 24 is not shown in FIG. 4. The second tooling pin 26 no longer contacts the substrate, as the second tooling pin 26 pivots away until the second tooling link 25 bears against the stop 29 (as shown in FIG. 1). The stop 29 prevents further pivoting of the second tooling mechanism 24 which could cause the second weight 28 to contact the base 12.

Now the preferred method of operation of the spin coating fixture 10 of the present invention may described. Again referring to FIG. 1, the fixture 10 is shown in an upright orientation with the tooling pins 20 and 26 disengaged. The gravity forces ($F_G$) are operative to pivot the weights 22 and 28 of the tooling mechanisms 18 and 24 to the disengaged orientation. The substrate may be lowered straight down onto the base 12 without contacting the tooling pins 20 and 26. Now referring to FIG. 2, the fixture 10 may be rotated 90° counter-clockwise thereby engaging the tooling pins 20 and 26 to hold the substrate against the base 12. The changing direction of the gravity forces ($F_G$) is operative to pivot the weights 22 and 28 of the tooling mechanisms 18 and 24, thereby engaging the tooling pins 20 and 26. The pivoting occurs because the weights 22 and 28 are on the same sides of the planes $PL_1$ and $PL_2$ as are the tooling pins 20 and 26.

FIG. 3 shows that the fixture 10 may be rotated further another 90°, and the change in the direction of the gravity forces ($F_G$) does not cause any movement of the weights 22 and 28 and the tooling pins 20 and 26. Fixture 10 provides the capability of at least 180° rotation, with the tooling pins 20 and 26 maintaining the position of the substrate to bear against the base 12. This allows coating to be sprayed on the substrate in several different attitudes. Alternatively, the coating may be sprayed onto the substrate while the fixture 10 is spinning. Also alternatively, the substrate may be dip coated prior to being loaded into the fixture 10.

Next, for the spinning operation the fixture 10 must be spun at a rate sufficient to generate enough centrifugal force ($F_C$) to engage the tooling pins 20 and 32. Spin coating fixtures commonly rotate at a rate between 1000 and 4000 revolutions per minute. The spinning of the fixture 10 generates centrifugal force ($F_C$) as described above, causing the weights 22 and 34 of the tooling mechanisms 18 and 30 to pivot, bringing the pins 20 and 32 into contact with the substrate. The pivoting occurs because the weight 34 is on the opposite side of the plane $PL_3$ as is the tooling pin 32. The spinning operation also causes the second tooling pin 26 to pivot away from the substrate, until the second link 25 contacts the stop 29, as was described earlier.

After the spinning operation is completed, it is necessary to slow down and stop the fixture 10. The fixture 10 is stopped in the upright orientation as shown in FIG. 1. The tooling pins 20 and 26 have pivoted away from the substrate. The tooling pin 32 also has pivoted away from the substrate (not shown). The gravity force ($F_G$) in the upright orientation will cause the third weight 34 of the third tooling mechanism 30 to move thereby pivoting the third pin 32 away from the substrate. An unobstructed removal of the substrate from the fixture 10 is possible.

It is understood that the exemplary spin coating fixture described herein and shown in the drawings represents only presently preferred embodiments of the invention. Indeed, various modifications and additions may be made to such embodiments without departing from the spirit and scope of the invention. These and other modifications and additions may be obvious to those skilled in the art and may be implemented to adapt the present invention for use in a variety of different applications.

What is claimed is:

1. A fixture for spin coating a planar substrate about an axis approximately parallel to the plane of the substrate, the fixture comprising:

a base against which the substrate bears;

a gravity-operated tooling pin movably connected to the base, to hold the substrate against the base in response to operation of gravity force as a result of rotation of the base about the axis; and a centrifugal-operated tooling pin movably connected to the base, to hold the substrate against the base in response to operation of centrifugal force as a result of rotation of the base about the axis.

2. The fixture of claim 1, wherein the gravity-operated pin holds the substrate against the base only when the base is rotated to other than a substantially upright orientation.

3. The fixture of claim 1, wherein the centrifugal-operated tooling pin holds the substrate against the base only when the base is rotated at a sufficient rate about the axis.

4. The fixture of claim 1, wherein the centrifugal-operated pin holds the substrate against the base with increasing force as the rate of rotation increases.

5. The fixture of claim 1, wherein the gravity-operated tooling pin is pivotally connected to the base.

6. The fixture of claim 1, wherein the centrifugal-operated tooling pin is pivotally connected to the base.

7. The fixture of claim 1, further comprising a stop connected to the base, to prevent the gravity-operated tooling mechanism from contacting the base in response to rotation of the base about the axis.

8. The fixture of claim 1 wherein the gravity-operated tooling pin is further operative to hold the substrate against the base in response to operation of centrifugal force as a result of rotation of the base about the axis.

9. The fixture of claim 8, wherein said gravity-operated tooling pin holds the substrate against the base in response to a combination of forces, commencing with a gravity force, and transitioning to a centrifugal force as rate of the rotation increases.

10. The fixture claim 9, wherein the gravity-operated tooling pin moves away from the substrate when the base is substantially at rest in a substantially upright orientation, such that the substrate may be removed in a substantially vertically upward direction from the base.

11. The fixture of claim 9, wherein the centrifugal-operated tooling pin moves away from the substrate when the base is substantially at rest, such that the substrate may be removed in a substantially vertically upward direction from the base.

12. A fixture for spin coating a planar substrate about an axis approximately parallel to the plane of the substrate, the fixture comprising:

a base against which the substrate bears;

a gravity-operated tooling pin movably connected to the base, to hold the substrate against the base in response to operation of gravity force as a result of rotation of the base about the axis; and a combination gravity/centrifugal-operated tooling pin movably connected to the base, to hold the substrate against the base in response to operation of gravity and centrifugal forces as a result of rotation of the base about the axis.

13. A fixture for spin coating a planar substrate about an axis approximately parallel to the plane of the substrate, the fixture comprising:

a base against which the substrate bears;

a centrifugal-operated tooling pin movably connected to the base, to hold the substrate against the base in response to operation of centrifugal force as a result of rotation of the base about the axis; and a combination gravity/centrifugal-operated tooling pin movably connected to the base, to hold the substrate against the base in response to operation of gravity and centrifugal forces as a result of rotation of the base about the axis.

14. A fixture for spin coating a planar substrate about an axis approximately parallel to the plane of the substrate, the fixture comprising:

a base against which the substrate bears; and a combination gravity/centrifugal-operated tooling pin movably connected to the base, to hold the substrate against the base in response to operation of gravity and centrifugal forces as a result of rotation of the base about the axis.

15. The fixture of claim 14, wherein said combination gravity/centrifugal-operated tooling pin holds the substrate against the base in response to a combination of forces, commencing with a gravity force, and transitioning to a centrifugal force as the rate of rotation increases.

16. The fixture of claim 14, wherein the combination gravity/centrifugal-operated tooling pin is pivotally connected to the base.

17. The fixture of claim 14, wherein the combination gravity/centrifugal-operated tooling pin moves away from the substrate when the base is substantially at rest in a substantially upright orientation, such that the substrate may be removed in a substantially vertically upward direction from the base.

18. A fixture for spin coating a planar substrate about an axis approximately parallel to the plane of the substrate, the fixture comprising:

a base against which the substrate bears;

a gravity-operated tooling mechanism pivotally connected to the base, having a linking member with a gravity-operated tooling pin at a first end and a weight at a second end, said gravity-operated tooling mechanism being pivotable such that said first tooling pin holds the substrate against the base in response to operation of gravity force on said weight as a result of rotation of the base about the axis; and a centrifugal-operated tooling pin pivotally connected to the base, having a linking member with a centrifugal-operated tooling pin at a first end and a weight at a second end, said centrifugal-operated tooling mechanism being pivotable such that said second tooling pin holds the substrate against the base in response to operation of centrifugal force on said weight as a result of rotation of the base about the axis.

19. The fixture of claim 8 wherein the gravity-operated tooling pin is further operative to hold the substrate against the base in response to operation of centrifugal force as a result of rotation of the base about the axis.

20. The fixture of claim 8, wherein said gravity-operated tooling pin holds the substrate against the base in response to a combination of forces, commencing with a gravity force, and transitioning to a centrifugal force as the rotational speed of the base increases.

21. A fixture for spin coating a planar substrate about an axis approximately parallel to the plane of the substrate, the fixture comprising:
- a gravity-operated tooling mechanism pivotally connected to the base, having a linking member with a first tooling pin at a first and a weight at a second end, said gravity-operated tooling mechanism being pivotable such that said first tooling pin holds the substrate against the base in response to operation of gravity force on said weight as a result of rotation of the base about the axis; and
- a combination gravity/centrifugal-operated tooling mechanism pivotally connected to the base, having a linking member with a first tooling pin at a first end and a weight at a second end, said combination gravity/centrifugal-operated tooling mechanism being pivotable such that said second tooling pin holds the substrate against the base in response to operation of gravity and centrifugal forces on said weight as a result of the rotation of the base about the axis.

22. A fixture for spin coating a planar substrate about an axis approximately parallel to the plane of the substrate, the fixture comprising:
- a centrifugal-operated tooling pin pivotally connected to the base, having a linking member with a tooling pin at one end and a weight at an opposing end, said centrifugal-operated tooling mechanism pivots such that said tooling pin holds the substrate against the base in response to operation of centrifugal force on said weight as a result of rotation of the base about the axis; and
- a combination gravity/centrifugal-operated tooling mechanism pivotally connected to the base, having a linking member with a tooling pin at one end and a weight at an opposing end, said combination gravity/centrifugal-operated tooling mechanism pivots such that said tooling pin holds the substrate against the base in response to operation of gravity and centrifugal forces on said weight as a result of the rotation of the base about the axis.

23. A fixture for spin coating a planar substrate about an axis approximately parallel to the plane of the substrate, the fixture comprising:
- a base against which the substrate bears; and
- a combination gravity/centrifugal-operated tooling mechanism pivotally connected to the base, having a linking member with a tooling pin at one end and a weight at an opposing end, said combination gravity/centrifugal-operated tooling mechanism pivots such that said tooling pin holds the substrate against the base in response to operation of gravity and centrifugal forces on said weight as a result of the rotation of the base about the axis.

24. A method of holding a planar substrate for spin coating about an axis approximately parallel to the plane of the substrate, the method comprising the steps of:
- placing the substrate against a base in a substantially upright orientation;
- rotating the base about the axis;
- holding the substrate against the base, in response to operation of gravity force as a result of the rotating of the base; and
- holding the substrate against the base, in response to operation of centrifugal force as a result of the rotating of the base.

25. The method of claim 24, further comprising the step of:
- spray coating the substrate while it is rotating.

26. The method of claim 24, further comprising the step of:
- dipping the substrate into a coating prior to placing the substrate in the fixture.

27. The method of claim 24, further comprising:
- stopping the rotating of the base about the axis, such that the base is in the substantially upright orientation;
- releasing the holding of the substrate, in response to operation of gravity force as a result of the stopping of the rotating of the base; and
- releasing the holding of the substrate, in response to operation of centrifugal force as a result of the stopping of the rotating of the base.

28. The method of claim 24, wherein:
- the releasing of the holding of the substrate is such that the substrate may be removed from the base in a substantially vertically upward direction; and
- the releasing of the holding of the substrate is such that the substrate may be removed from the base in a substantially vertically upward direction.

29. A method of holding a planar substrate for spin coating about an axis approximately parallel to the plane of the substrate, the method comprising the steps of:
- placing the substrate against a base in a substantially upright orientation;
- rotating the base about the axis; and
- holding the substrate against the base, in response to operation of gravity and centrifugal forces as a result of the rotating of the base.

30. The method of claim 29, further comprising:
- stopping the rotating of the base about the axis, such that the base is in a substantially upright orientation; and
- releasing the holding of the substrate such that the substrate may be removed from the base in a substantially vertically upward direction, in response to operation of gravity and centrifugal forces as a result of the stopping of the rotating of the base.

* * * * *